(12) United States Patent
Chen et al.

(10) Patent No.: US 12,190,033 B2
(45) Date of Patent: Jan. 7, 2025

(54) METHOD FOR PARALLELISM-AWARE WAVELENGTH-ROUTED OPTICAL NETWORKS-ON-CHIP DESIGN

(71) Applicant: AnaGlobe Technology, Inc., Hsinchu (TW)

(72) Inventors: Kuan-Cheng Chen, Taitung County (TW); Yan-Lin Chen, Hsinchu (TW); Yu-Sheng Lu, New Taipei (TW); Yao-Wen Chang, Taipei (TW); Yu-Tsang Hsieh, Hsinchu County (TW)

(73) Assignee: ANAGLOBE TECHNOLOGY, INC., Hsinchu (TW)

( * ) Notice: Subject to any disclaimer, the term of this patent is extended or adjusted under 35 U.S.C. 154(b) by 528 days.

(21) Appl. No.: 17/682,384

(22) Filed: Feb. 28, 2022

(65) Prior Publication Data

US 2023/0274056 A1 Aug. 31, 2023

(51) Int. Cl.
*G06F 30/30* (2020.01)
*G06F 30/327* (2020.01)

(52) U.S. Cl.
CPC .................................. *G06F 30/327* (2020.01)

(58) Field of Classification Search
CPC ..................................................... G06F 30/327
See application file for complete search history.

(56) References Cited

U.S. PATENT DOCUMENTS

| 9,882,655 B2* | 1/2018 | Li | H04J 14/0227 |
| 11,694,000 B2* | 7/2023 | Han | G06F 30/20 |
| | | | 703/2 |
| 2016/0021437 A1* | 1/2016 | Stroetmann | H04Q 11/0071 |
| | | | 398/50 |

\* cited by examiner

*Primary Examiner* — Jack Chiang
*Assistant Examiner* — Brandon Bowers
(74) *Attorney, Agent, or Firm* — MUNCY, GEISSLER, OLDS & LOWE, P.C.

(57) ABSTRACT

A method for a parallelism-aware wavelength-routed optical networks-on-chip design is proposed, which is executed by a computer, the method comprising using the computer to perform the following: providing a WRONoC netlist, design specs and design rules; performing a network construction such that potential positions of each core of a plurality of cores, a plurality of waveguides and a plurality of microring resonators (MRRs) are determined to create a topology; performing a message routing to minimize MRR type usage of the MRRs in the topology; and performing a MRR radius selection to select a radius from MRR-radius options for each MRR type in said topology based on a simulated annealing.

20 Claims, 11 Drawing Sheets

METHOD FOR PARALLELISM-AWARE WAVELENGTH-ROUTED OPTICAL NETWORKS-ON-CHIP DESIGN

TECHNICAL FIELD

The present invention relates to a wavelength-routed optical network-on-chip (WRONoC) technique, and more particularly, to a method for parallelism-aware wavelength-routed optical networks-on-chip design.

BACKGROUND

As the number of intellectual property (IP) cores on a chip grows, the demand for effective and efficient on-chip communication also increases. The optical network-on-chip (ONoC) offers high-bandwidth, low-power, and low-latency communication, which is suitable for communication in giga-scale multiprocessor system-on-chips (MPSoCs).

ONoCs can be divided into two categories: control-network-based ONoCs and wavelength-routed-based ones. The primary difference between them is the microring resonators (MRRs) used for signal switching. The control-network-based ONoCs use configurable MRRs, which require extra arbitration time during operation. In contrast, the wavelength-routed-based ONoCs (WRONoCs) use passive MRRs, which set up signal paths during design time. Thus, the WRONoCs can transmit data without arbitration during operation, offering ultra-low latency communications and saving dynamic control power.

The wavelength-routed optical network-on-chip (WRONoC) emerges as a promising solution for multi-core system communication, providing high bandwidth, high-speed, low-power, and low-latency transmission. However, as the number of cores in a WRONoC increases, some wavelength-routed optical network-on-chip (WRONoC) topologies could be infeasible with bandwidth and crosstalk constraints.

SUMMARY OF THE INVENTION

In this invention, a parallelism-aware WRONoC design flow is proposed to optimize parallelism in topology generation and radius selection. The proposed design flow guarantees to generate a parallelism-optimal topology for full connectivity; and parallelism-optimal topology for customized connectivity if the netlist meets certain conditions.

In this invention, a method for a parallelism-aware wavelength-routed optical networks-on-chip (WRONoC) design is proposed, which is executed by a computer, the method comprising using the computer to perform the following: providing a WRONoC netlist, design specs and design rules stored in a memory for the computer-readable medium; performing a network construction such that potential positions of each core of a plurality of cores, a plurality of waveguides and a plurality of microring resonators (MRRs) are determined to create a topology stored in the memory; performing a message routing to minimize MRR type usage of the MRRs in the topology; and performing a MRR radius selection to select a radius from MRR-radius options for each MRR type in said topology based on a simulated annealing.

According to one aspect, each core of said plurality of cores is decomposed into a sender-receiver pair. The plurality of waveguides are classified into horizontal waveguides, vertical waveguides and ring-like waveguides in the network construction. The potential positions of the horizontal waveguides are on each core's right, allowing a signal emission from senders, potential positions of the vertical waveguides are on each core's top, allowing a signal transmission to receivers, and potential positions of the ring-like waveguides are close to a boundary of the topology, connecting the horizontal waveguides on a bottom-right and the vertical waveguides on a top-left in the network construction.

According to another aspect, signals transmitted from an identical sender are activating different MRR types and signals transmitted to an identical receiver are activating different MRR types during the message routing.

According to one aspect, each core of the plurality of cores is occupied a unique absolute position during the message routing. A default path has a last signal extracted from compound signal sent by its sender, and a first signal recombined to the vertical waveguide towards its receiver. The simulated annealing is performing to replace a radius in a radius sequence with an unselected radius from the MRR-radius options, swap two radii in the radius sequence and sort the radius sequence according to a cardinality of a resonance wavelength of each radius.

In the invention, a non-transitory computer-readable medium containing instructions is proposed, which when read and executed by a computer, cause the computer to execute a method for parallelism-aware wavelength-routed optical networks-on-chip design, wherein the method comprises the above-mentioned steps.

BRIEF DESCRIPTION OF THE DRAWINGS

The components, characteristics and advantages of the present invention may be understood by the detailed descriptions of the preferred embodiments outlined in the specification and the drawings attached.

DETAILED DESCRIPTION

Figure 1B:
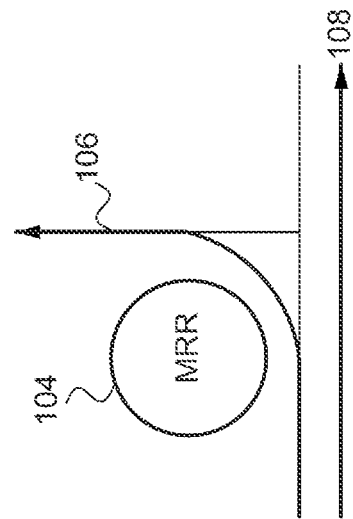
FIG. 1B shows on-resonance signal activating the MRR and changing its direction, while the off-resonance signal ignores this MRR.

Some preferred embodiments of the present invention will now be described in greater detail. However, it should be recognized that the preferred embodiments of the present invention are provided for illustration rather than limiting the present invention. In addition, the present invention can be practiced in a wide range of other embodiments besides those explicitly described, and the scope of the present invention is not expressly limited except as specified in the accompanying claims.

In this invention, the toward optimal topology generation and efficient radius selection is proposed for parallelism-aware wavelength-routed optical networks-on-chip (WRONoC) design. The invention provides a parallelism-aware WRONoC design flow to generate topology and select the actual MRR radius. With the parallelism-aware ILP formulation, a parallelism-optimal fully-connected topology can be generated. In WRONoC designs, there are two major stages: topology generation and MRR-radius selection. The main purpose of topology generation is to determine each device's position and the connections among devices. Topology generation can be further divided into two parts: network construction and message routing. First, in network construction, the waveguide structures and the potential positions of each core (device), waveguide, and MRR are determined. Then, in message routing, the MRR types representing MRRs with the same radius, and the actual positions of the devices are decided. For MRR-radius selection, the radius for each MRR type and the wavelengths used for each signal are determined. Embodiments of the present invention may be used in a variety of layout applications. Compared with the state-of-the-art methods, experimental results show a 42.2% improvement in parallelism. Experimental results have shown that the proposed design flow is superior to the existing WRONoC design flows in parallelism and efficiency. Besides, the proposed radius selection method can significantly reduce runtime without performance loss.

Typical WRONoC waveguide structures include crossbars and rings (please refer to: S. Le Beux, et al., "Optical crossbars on chip, a comparative study based on worst-case losses," Concurrency and Computation: Practice and Experience, 2014, 26(15), pp. 2492-2503; S. Le Beux, et al., "Optical ring network-on-chip (ORNoC): Architecture and design methodology," in Proceedings of 2011 Design, Automation & Test in Europe, 2011). The ring structure causes higher propagation losses and consumes more power as a result of its poor scalability and high connection requirements. The invention proposes the more promising crossbar structure for design.

Figure 1A:
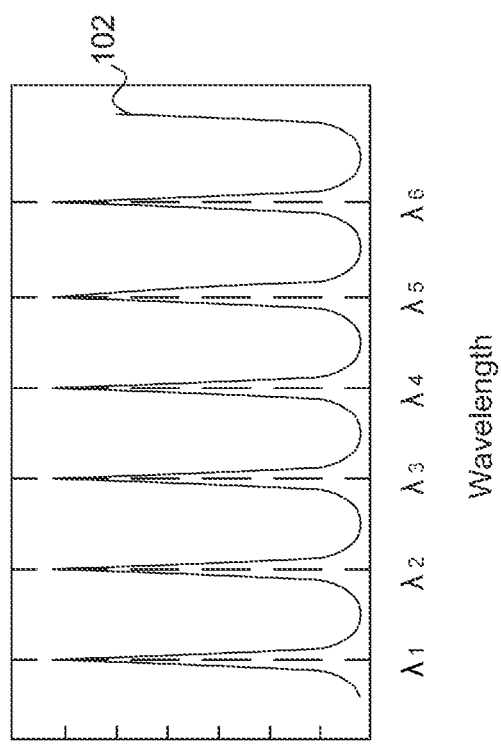
FIG. 1A shows a transmission characteristic of the MRR.

In crossbar-based WRONoC designs, MRR is a key element for signal switching among different waveguides. In MRR-radius selection, the radius of each MRR type is determined because different radii of MRRs map to different resonance wavelengths. The resonant condition for an MRR of radius $\rho$ is as follows:

$$\lambda_{res}=2\pi\rho\times n_{eff}/i, i=1,2,3,\qquad(1)$$

where $\lambda_{res}$ is the resonance wavelength, $n_{eff}$ is the effective refractive index, and i is a positive integer. If a signal's wavelength matches one of the resonance wavelengths of an MRR, the signal will activate the MRR and switch from one waveguide to another. Otherwise, the signal will ignore the MRR and keep moving along the original waveguide. Furthermore, because an MRR can be activated by more than one wavelength, by using multiple non-overlapping wavelengths, multiple signals can be transmitted simultaneously within a single waveguide to realize parallel signal communications. Take FIG. 1A as an example, it shows a transmission characteristic of a MRR. To send signals from the left side to the top side along a signal path 106, it needs to transmit signals with wavelengths that activate a MRR 104, shown in FIG. 1B. According to the spectrum 102 of the MRR 104, wavelengths $\lambda_1, \lambda_2, \lambda_3, \lambda_4, \lambda_5$ and $\lambda_6$ are available. As a result, at most six signals using six different non-overlapping wavelengths can be simultaneously transmitted, and the parallelism for this signal path 106 is hence defined as six. The on-resonance signal 106 activates the MRR 104 and changes its direction, while the off-resonance signal 108 ignores this MRR 104.

Figure 2:
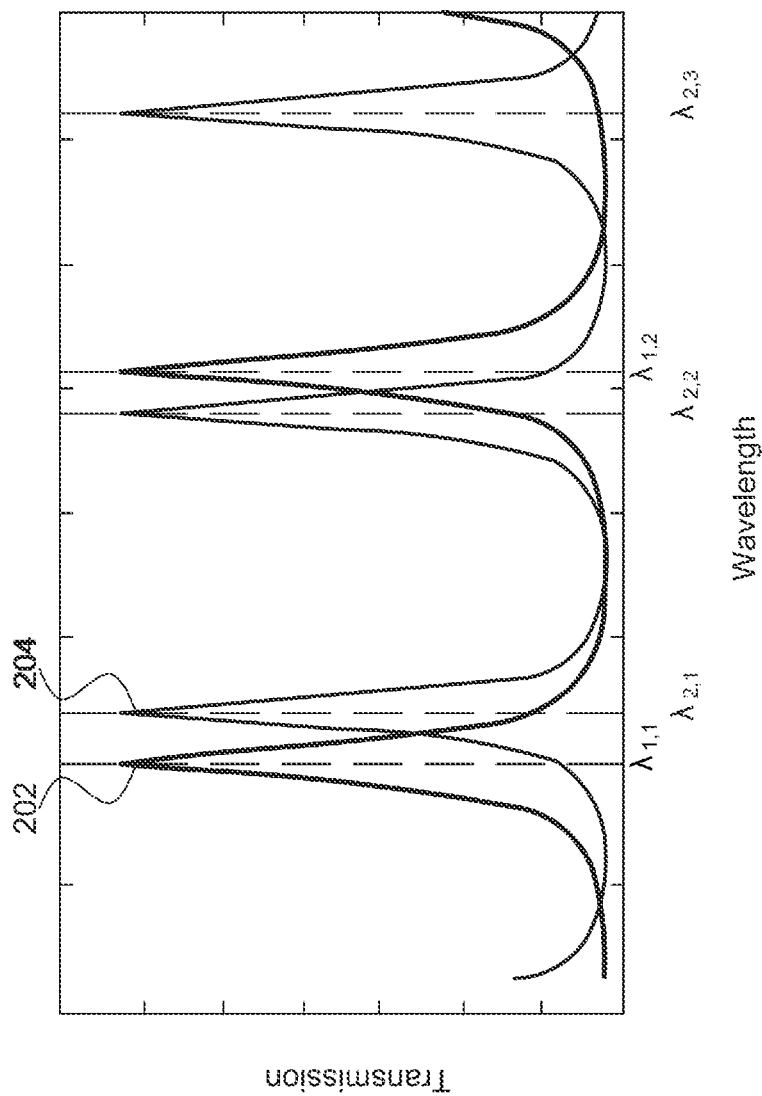
FIG. 2 shows the transmission spectra of two MRRs with different radii, where $\lambda_{i,j}$ is the jth resonance wavelength of radius i.
Figure 3B:
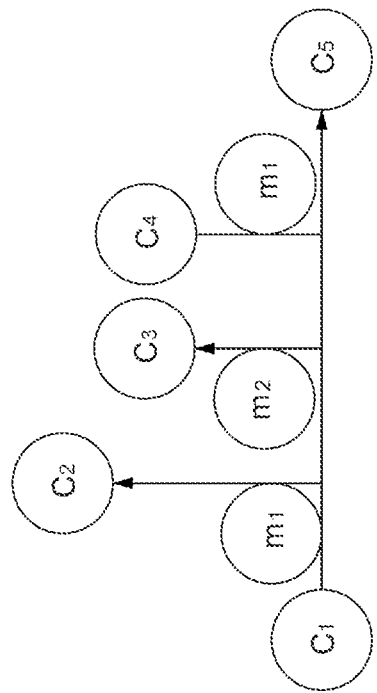
FIG. 3B shows a feasible topology.
Figure 3A:
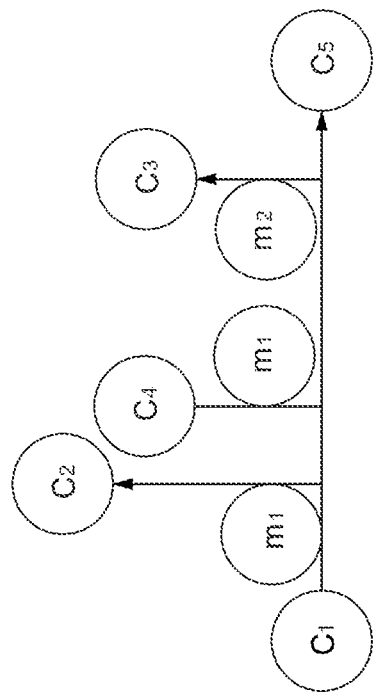
FIG. 3A shows an infeasible topology.

As the number of cores (devices) in a WRONoC increases, some WRONoC topologies could be infeasible with the bandwidth and crosstalk constraints if bit-level parallelism is not considered during topology generation. That is, parallelism is optimized only in MRR-radius selection, resulting in suboptimal results. Take FIG. 2 as an example. The curves 202 and 204 are the respective transmission spectra of the MRRs with radii $\rho1$ and $\rho2$, as shown in FIG. 2. Assume there are four signals, (c1, c2), (c1, c3), (c1, c5), and (c4, c5), where (ci, cj) denotes the signal from core ci to core cj. Besides, it assumes that the safe distance A considering crosstalk is larger than max ($|\lambda_{1,1}-\lambda_{2,1}|$, $|\lambda_{1,2}-\lambda_{2,2}|$). If a topology is designed unwisely, the topology might be infeasible no matter how radii are assigned to each MRR type. For the topology in FIG. 3A, radius $\rho1$ is assigned to MRR type m1 and radius $\rho2$ to MRR type m2. Because the distance between $\lambda_{1,1}$ and $\lambda_{2,1}$ and the distance between $\lambda_{1,2}$ and $\lambda_{2,2}$ are too close, signal (c4, c5) transmitted using $\lambda_{1,1}$ or $\lambda_{1,2}$ would accidentally activate the MRR m2, resulting in a routing error. Similarly, if radius $\rho2$ is assigned to MRR type m1 and radius $\rho1$ to MRR type m2, the signal (c1, c3) would also accidentally activate the MRR m1, resulting in another routing error. As a result, there is no feasible MRR type assignment result for this topology. However, if parallelism during topology generation is considered, a feasible topology can be designed according to the netlist. That is, if parallelism is considered during topology generation, topology in the manner can be generated shown in FIG. 3B. Then, radius $\rho1$ can be assigned to MRR type $m_1$ and radius $\rho2$ to MRR type m2 to this topology, making the worst-case parallelism nonzero. To maximize bit-level communication, a structure is designed that supports efficient message routing in network construction, the MRR type and actual connection are selected to minimize the number of MRR types in message routing, and an available wavelength is assigned to set for each signal in MRR-radius selection.

The invention introduces a routing mechanism and a parallelism calculation in WRONoC.

Figure 4:
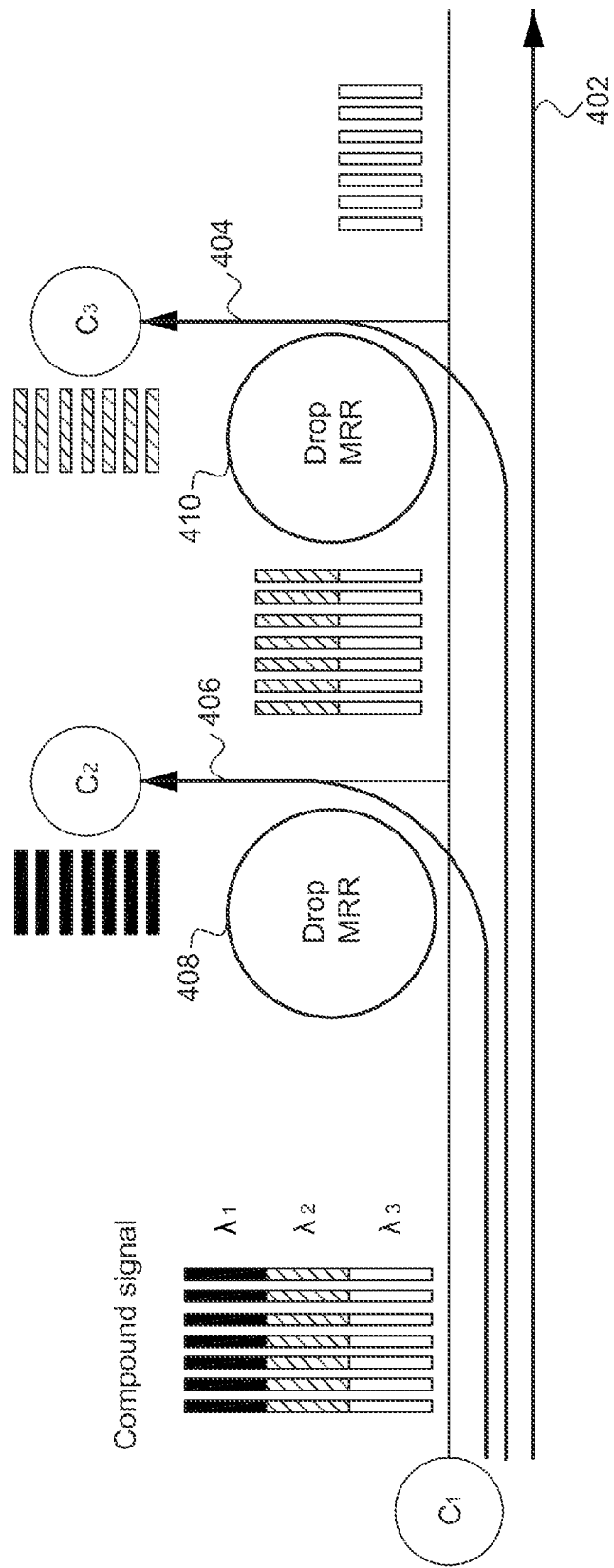
FIG. 4 shows the compound signal transmitted from core c1 resolved by drop MRRs and headed to different destinations.

WRONoC Routing Mechanism:

The MRR-based routing mechanism is introduced: Drop function and Add function (please refer to: M. Tala, M. Castellari, M. Balboni, and D. Bertozzi, "Populating and exploring the design space of wavelength-routed optical network-on-chip topologies by leveraging the add-drop filtering primitive," in Proc. of NOCS, 2016). Drop function resolves a compound signal in a waveguide into individual components so that each component can be transmitted to a different destination. Drop function can be accomplished with drop optical filters such as MRRs. MRRs realize the Drop function by extracting on-resonance signals to their corresponding destination. For example, in FIG. 4, core c1 transmits a compound signal with wavelengths $\lambda_2$, and $\lambda_3$. The compound signal transmitted from core c1 is resolved by drop MRRs and heads to different destinations. First, when the compound signal passes through a MRR 408, the signal 406 would be extracted and head to core c2. Then, when the compound signal passes through a MRR 410, the signal 404 would be extracted and head to core c3. Finally, the signal 402 continues moving along the original waveguide towards its destination. Add function recombines the resolved signals into a single waveguide to be transmitted to the same core.

Figure 5:
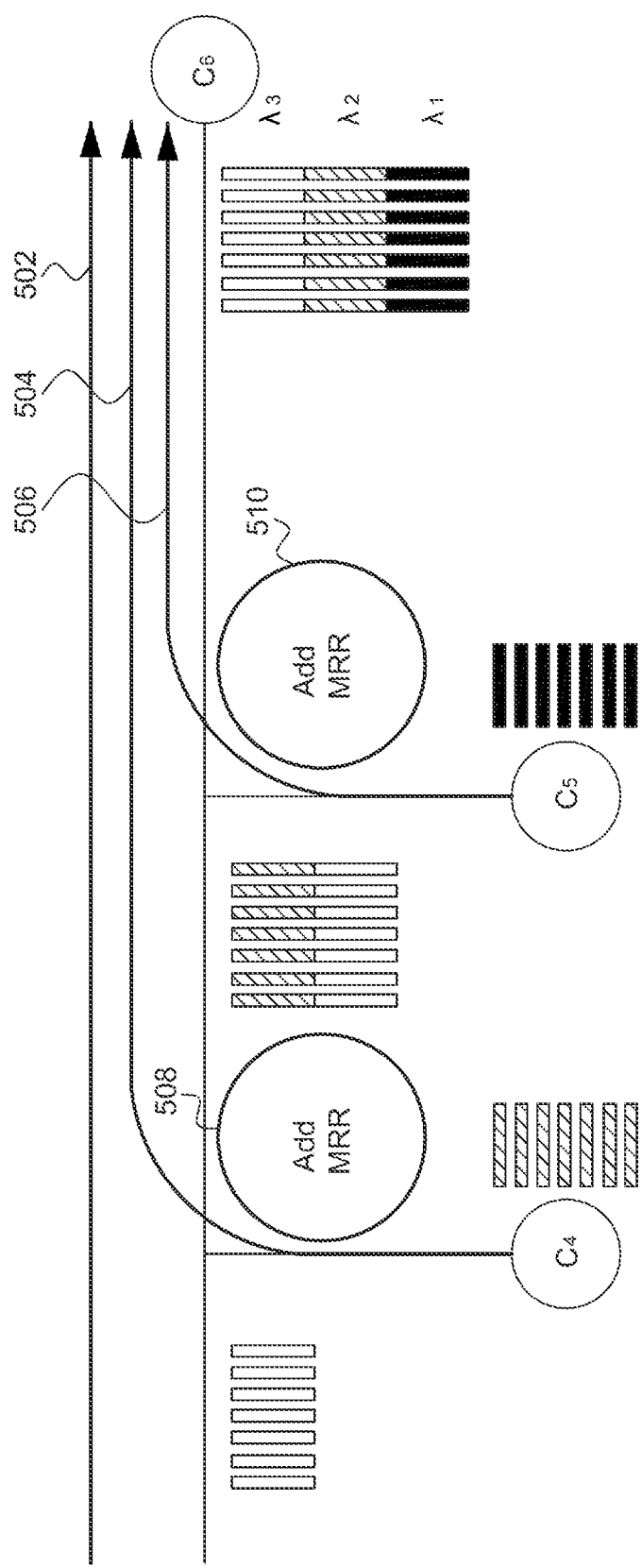
FIG. 5 shows three resolved signals recombined by add MRRs and headed to core c6.

Add function can also be accomplished by MRRs. For example, in FIG. 5, three individual signals with wavelengths $\lambda_1$, $\lambda_2$, and $\lambda_3$ are to transmit to core c6, but only a signal 502 traverses along the waveguide connected to core c6. By placing MRRs 508 and 510 in the waveguide intersections, a signal 504 from core c4 and a signal 506 from core c5 can be recombined into the waveguide connected to c6 and propagate to their destination. That is, three resolved signals are recombined by add MRRs and head to core c6.

With Drop and Add functions, signals can be resolved and recombined among waveguides to realize designs with any connectivity Parallelism Calculation:

Here, the equations are introduced to calculate the parallelism for a signal path, a set of signal paths, and a topology. The set of all MRR types is denoted that the signal path p should activate as $ON_p$, and that should not activate as $OFF_p$. For example, in FIG. 3A, the signal path p from core c1 to core c3 needs to activate m2; thus $ON_p=\{m2\}$. Meanwhile, it should not activate m1, so $OFF_p=\{m1\}$. Then, the parallelism calculation for a signal path p counts the number of $ON_p$'s resonance wavelengths not conflicting with $OFF_p$'s resonance wavelengths. Assume the radius of each MRR type in a given topology is fixed, the safe distance between wavelengths considering crosstalk is denoted as A, and the resonance wavelength set of MRR type mi is denoted as $\Omega i$.

A set operation $\ominus$ is defined that returns the elements from the first set without conflicting with the second set as follows:

$$S_1 \ominus S_2 = \{e_1 \in S_1 \| e_1 - e_2 | > \forall e_2 \in S_2\} \quad (2)$$

The parallelism of a signal path p is given by $$v(p) = |\cap_{m_i \in ON_p} \Omega_i \ominus \cup_{m_i \in Off_p} \Omega_i| \quad (3)$$

Besides, the worst-case parallelism of a set of signal paths P is as follows:

$$(P) = \min_{p \in P} \{v(p)\} \quad (4)$$

Finally, the worst-case parallelism of a topology t is $$v_w^T(t) = \min_{p \in P_t} \{v(p)\} \quad (5)$$

where $P_t$ is the set of all signal paths in topology t. Based on the equations mentioned above, it can maximize the worst-case parallelism of a topology.

The parallelism-aware WRONoC design addressed in this invention can be formulated as follows, (i) Given: a WRONoC netlist and MRR-radius options; (ii) Output: generate a WRONoC topology, the radius of each MRR type in the topology and the values of wavelengths for data transmission in each signal path; and (iii) Objective: the worst-case parallelism (determine the radius for each MRR type to maximize the worst-case parallelism).

Figure 6:
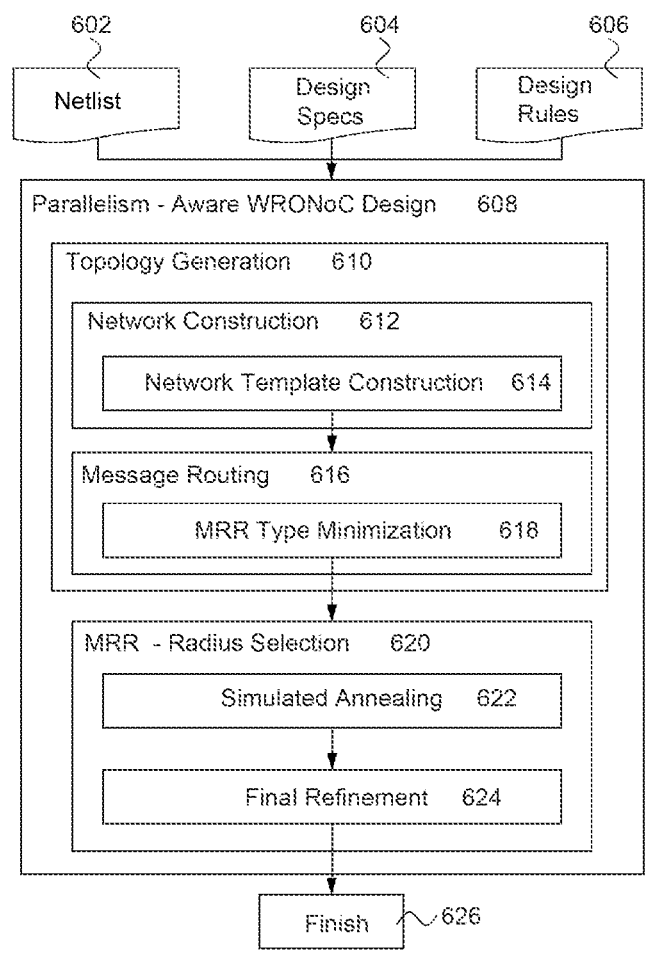
FIG. 6 shows a process flow of a method for parallelism-aware wavelength-routed optical networks-on-chip (WRONoC) design.

FIG. 6 shows the process flow of a parallelism-aware WRONoC design of the present invention. The process flow comprises the following three stages: (1) Network Construction, (2) Message Routing, and (3) MRR-radius Selection. In Network Construction, a network template that supports efficient message routing is generated. In Message Routing, ILP is used to minimize the number of MRR types. In MRR-radius Selection, the radius is selected for each MRR type to maximize the parallelism. The three stages are detailed in the following, respectively.

Firstly, a WRONoC netlist 602, design specs 604 and design rules 606 of devices are given (inputted). The WRONoC netlist, design specs and design rules are stored in a memory of/for a computer-readable medium. Based on the given data, the parallelism-aware WRONoC design 608 is performed by the following flows including the three stages, Network Construction 612, Message Routing 616, and MRR-radius Selection 620. The main purpose of the topology generation 610 is to determine the connections among devices. Topology generation 610 can be further divided into two parts: Network Construction 612 and Message Routing 616.

Figure 7:
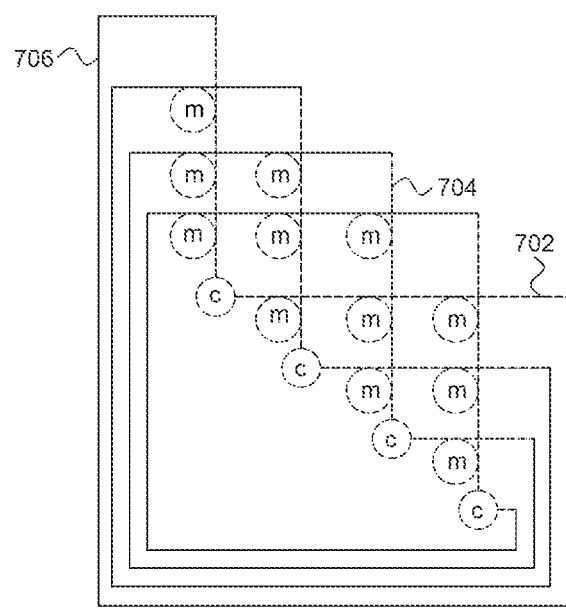
FIG. 7 illustrates a network template with cores for a 4×4 modified crossbar router.
Figure 8:
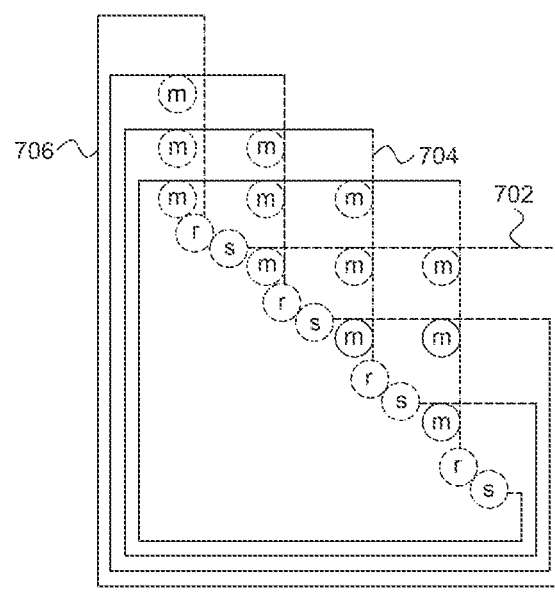
FIG. 8 illustrates a network template with senders and receivers for a 4×4 modified crossbar router.

Network Construction:

In the Network Construction 612 stage, the potential position of each core of cores, a plurality of waveguides, and a plurality of MRRs are determined. That is, it performs a network construction such that potential positions of each core of a plurality of cores, a plurality of waveguides and a plurality of microring resonators (MRRs) are determined to create a topology stored in the memory. The Network Construction 612 stage includes Network Template Construction 614. The folded crossbar concept and a WRONoC topology proposed in Ramini et al. (please refer to: L. Ramini, P. Grani, S. Bartolini, and D. Bertozzi, "Contrasting wavelength-routed optical NoC topologies for power-efficient 3D-stacked multicore processors using physical-layer analysis," in Proc. of DATE, 2013) are employed to generate the invention's network template. The invention modifies the folded crossbar topology. FIG. 7 shows an example network template for a four-core (c: potential core) design. As shown in FIG. 7, the potential core positions are along the diagonal of the template. To emphasize the different functionalities of a core, each core is further decomposed into a sender-receiver pair (s/r: potential sender/receiver), as shown in FIG. 8. A sender (s) emits signals into waveguides, and a receiver (r) receives signals from waveguides. Therefore, the invention's network template can be re-expressed so that each potential core position is transformed into a potential sender-receiver pair position. FIG. 8 shows the re-expressed four-core network template.

Then, the waveguides are classified into three categories: horizontal waveguides 702, vertical waveguides 704, and ring-like waveguides 706. Their potential positions are determined as follows. The potential positions of horizontal waveguides are on each core's right, allowing signal emission from the senders. The potential positions of vertical waveguides are on each core's top, allowing the signal transmission to the receivers. The potential positions of ring-like waveguides are close to the boundary of the template (topology), connecting horizontal waveguides on the bottom-right and vertical waveguides on the top-left.

Finally, the potential MRR (m) positions are at the bottom left of each waveguide intersection, which can be used for signal switching from a horizontal waveguide 702 to a vertical waveguide 704 or a ring-like waveguide 706 to a vertical waveguide 704.

With the invention's network template, every core-to-core signal transmission becomes feasible. Moreover, only one possible signal path exists for each signal (ci, cj) in the template, which consists of the horizontal waveguide next to ci, the vertical waveguide on the top of cj, the ring-like waveguide that connects the above two waveguides if they are not connected, and the MRR at the intersection. This property significantly reduces the effort in the message routing stage because the waveguide and MRR positions can be easily decided as long as the core positions are determined.

Message Routing:

Device variables are described as follows.

d: a WRONoC design $C=\{c_i|1\leq i\leq|C|\}$: represents each core in design d $S=\{s_i|1\leq i\leq|C|\}$: represents each sender in design d $R=\{r_i|1\leq i\leq|C|\}$: represents each receiver in design d $c_s$: the core of sender s $c_r$: the core of receiver r $S_r$: the set of all senders that transmit signals to receiver r $R_s$: the set of all receivers that receive signals from sender s In this stage of the Message Routing 616, the devices' actual positions and each MRR's type are determined. Because the waveguide and MRR positions can be easily determined, only core positions and each MRR's type need to be decided. Meanwhile, to increase the topology parallelism, the invention aims to choose MRR types cleverly so that the following condition holds in the proposed topology t:

$$\forall p \in P_t, \forall i,j \in \mathbb{Z}^+: ((i<j)^{\wedge}(m_i \in ON_p)) \Rightarrow m_j \notin OFF_p \quad (6)$$

where i, j are positive integers. In other words, for a signal path p that activates MRR type $m_i$, any MRR type $m_j$ with j>i should not appear in $OFF_p$. In this way, more resonance wavelengths of $m_i$ can be used in the signal path p because the wavelengths will not conflict with the resonance wavelengths of $m_j$ with j>i, resulting in a potential increase in topology parallelism $v_w^T(t)$.

An ILP formulation is proposed to determine the core positions and each MRR's type while ensuring that the property stated in (6) always holds.

The following describes the MRR Type Minimization 618.

MRR Types:

Let (s, r) be the signal transmitted from sender s to receiver r. An integer variable $m_{s,r}$ is introduced to represent the type of the MRR activated by (s, r). $m_{s,r}=i$ indicates that signal (s, r) activates MRR type $m_i$. To avoid signal collision, signals that activate the same MRR type should not have any path overlap, which leads to the following two constraints on MRR types:

Signals transmitted from the same sender should activate different MRR types.

Signals transmitted to the same receiver should activate different MRR types.

These constraints are formulated as follows:

$$\forall s \in S, \forall r_i, r_j \in R_s, i \neq j$$

$$m_{s,r_i} \leq m_{s,r_j} - 1 + M\delta_s^{r_i,r_j} \quad (7a)$$

$$m_{s,r_i} \geq m_{s,r_j} - 1 - M(1-\delta_s^{r_i,r_j}) \quad (7b)$$

$$\forall r \in R, \forall s_i, s_j \in S_r, i \neq j$$

$$m_{s_i,r} \leq m_{s_j,r} - 1 + M\delta_s^{r_i,r_j} \quad (8a)$$

$$m_{s_i,r} \geq m_{s_j,r} + 1 - M(1-\delta_s^{r_i,r_j}) \quad (8b)$$

where S and R are the sets of all senders and receivers in the design, respectively. $R_S$ is the set of receivers to which s transmits signals, and $S_r$ is the set of senders transmitting signals to r. M is an extremely large auxiliary constant, and $\delta_s^{r_i,r_j}$, $\delta_s^{s_i,s_j}$ are auxiliary binary variables. When $\delta_s^{r_i,r_j}=1$, Constraint (7a) becomes a tautology, and $m_{s,r_i}$ will be forced to take a value larger than because of Constraint (7b). In contrast, if $\delta_s^{r_i,r_j}=0$, Constraint (7b) becomes a tautology, and $m_{s,r_i}$ will be forced to take a value smaller than $m_{s,r_j}$ because of Constraint (7a). Constraint (8) works in a similar way. Overall, Constraints (7) and (8) make sure that $m_{s,r_i} \neq m_{s,r_j}$ and $m_{s_i,r} \neq m_{s_j,r}$.

To restrict the number of MRR types used, an integer value K is introduced to indicate the maximum value for each $m_{s,r}$ (MRR type of the MRR activated by signal (s, r)) and set the following constraint:

$$1 \leq m_{s,r} \leq K, \forall s \in S, \forall r \in R_s \quad (9)$$

Figure 9:
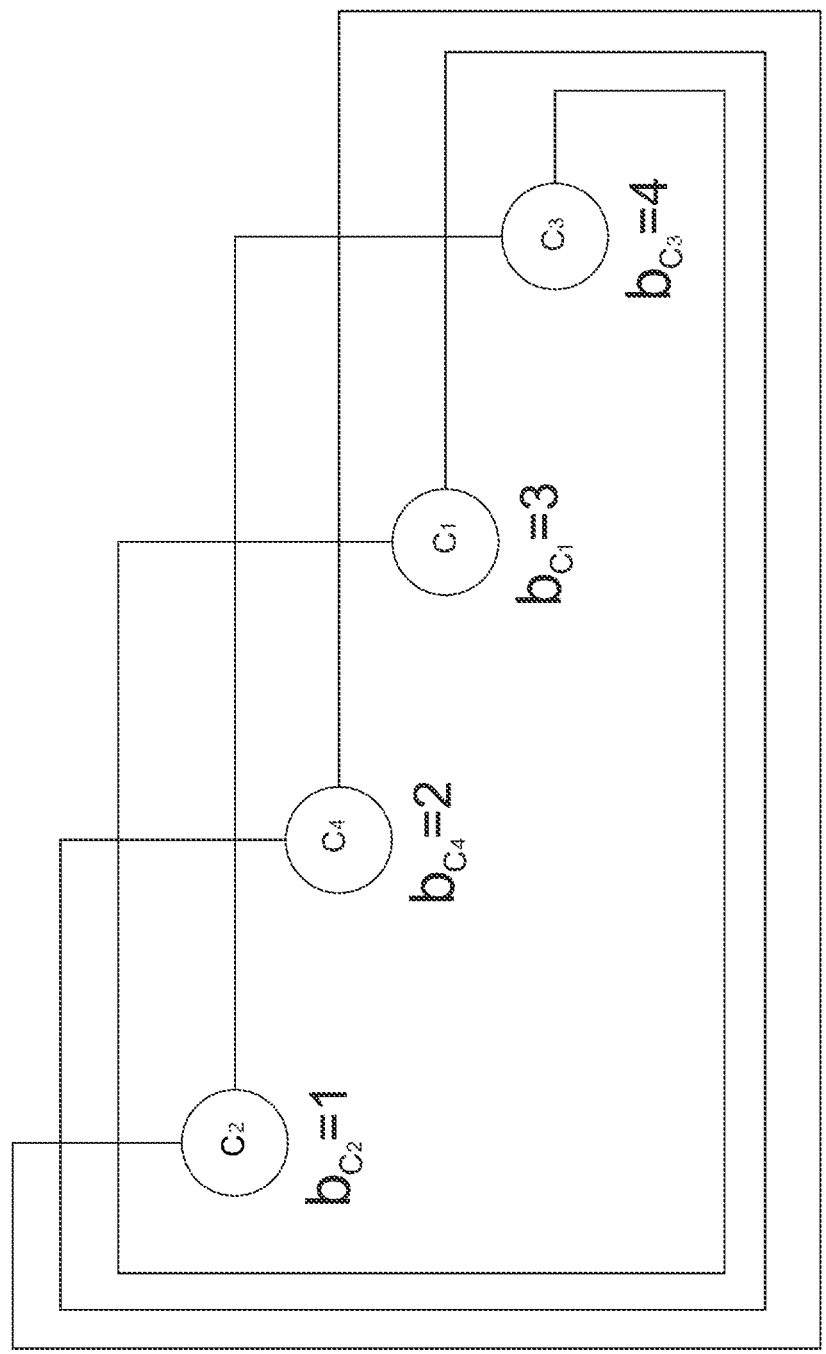
FIG. 9 illustrates an example of core position mapping.

Core Position:

For each core c, an integer variable $b_c$ is introduced to represent the absolute position to which it is mapped in the network template, where the i-th absolute position denotes the i-th position counted from the top-left corner of the network template. As shown in FIG. 9, which shows an example of core position mapping, a core c will be mapped to the $b_c$-th absolute position in the network structure.

Because a core must be assigned to a position and two cores cannot be assigned to the same position, each core of a plurality of cores is occupied a unique absolute position during message routing. Thus, it has the following constraints:

$$1 \leq b_c \leq |C|, \forall c \in C \quad (10)$$

$$b_{c_i} \leq b_{c_j} - 1 + M\mu_{c_i,c_j}, \forall c, c_i, c_j \in C, i \neq j \quad (11a)$$

$$b_{c_i} \geq b_{c_j} + 1 - M(1-\mu_{c_i,c_j}), \forall c, c_i, c_j \in C, i \neq j \quad (11b)$$

where C is the set of all cores in the WRONoC design and $\mu_{ci,cj}$ is an auxiliary binary variable. The value of $\mu_{ci,cj}$ makes either Constraint (11a) or Constraint (11b) a tautology, and the other constraint forces $b_{c_i} < b_{c_j}$ or $b_{c_i} > b_{c_j}$. Overall, these constraints make sure that every $b_c$ takes distinct values from 1 to $|C|$.

Meanwhile, a binary variable $$b_{c_i}^{c_j}$$

is used to represent core c/s relative core position to core $c_i$, where each $$b_{c_i}^{c_j}\text{'s}$$

value is defined as follows:

$$b_{c_i}^{c_j} = b_{c_j} - b_{c_i} + \mu_{c_i,c_j}|C|, \forall c_i, c_j \in C, i \neq j, \quad (12)$$

$$b_{c_i}^{c_j} = \begin{cases} b_{c_j} - b_{c_i}, & b_{c_j} > b_{c_i} \\ b_{c_j} - b_{c_i} + |C|, & b_{c_j} < b_{c_i} \end{cases} \quad (13)$$

Note that the value of $$b_{c_i}^{c_j}$$

reflects the number of intersections through which signal ($c_i$, $c_j$) passes before and after it drops or adds to another waveguide. The larger $$b_{c_i}^{c_j}$$

is, the more intersections ($c_i$, $c_j$) pass through before and after it drops or adds.

Resonance Wavelength Conflict Reduction:

To satisfy nice property (6), it needs to add more constraints specifying the relationship between the MRR type and the core position.

Consider two signals (s, $r_i$) and (s, $r_j$) transmitted along signal paths ρ1 and ρ2, respectively. If $$b_{c_s}^{c_{r_i}} < b_{c_s}^{c_{r_j}},$$

this means that (s, $r_j$) passes through more intersections than (s, $r_i$) before they drop. Because the two signals are transmitted from the same sender and thus share the same waveguide initially, (s, $r_j$) must travel through $m_{s,r_i}$. Therefore, $m_{s,r_i}$ must be in $OFF_{p2}$.

Meanwhile, consider two signals ($s_i$, r) and ($s_j$, r), transmitted along signal paths p3 and p4, respectively. If $$b_{c_{s_i}}^{c_r} < b_{c_{s_j}}^{c_r},$$

this means that ($s_j$, r) passes through more intersections than ($s_i$, r) after they add. Because the two signals are transmitted to the same receiver and thus share the same vertical waveguide, ($s_i$, r) must travel through $m_{s_j,r}$. Therefore, $m_{s_j,r}$ must be in $OFF_{p2}$.

As a result, to satisfy nice property (6), the following statements must hold in the invention's topology:

$$b_{c_s}^{c_{r_i}} < b_{c_s}^{c_{r_j}} \Leftrightarrow m_{s,r_i} < m_{s,r_j}, \forall s \in S, \forall r_i, r_j \in R_s, i \neq j \quad (14a)$$

$$b_{c_{s_i}}^{c_r} < b_{c_{s_j}}^{c_r} \Leftrightarrow m_{s_i,r} < m_{s_j,r}, \forall r \in R, \forall s_i, s_j \in S_r, i \neq j \quad (14b)$$

An auxiliary binary variable o-c introduced is to indicate the relation between $$b_{c_i}^{c_j} \text{ and } b_{c_i}^{c_k}$$

and set the following constraints:

$$\forall c_i, c_j, c_k \in C, i \neq j, j \neq k, i \neq k \quad (15a)$$

$$b_{c_i}^{c_j} \leq b_{c_i}^{c_k} - 1 + M\sigma_{c_i}^{c_j,c_k}$$

$$b_{c_i}^{c_j} \geq b_{c_i}^{c_k} + 1 - M(\sigma_{c_i}^{c_j,c_k}) = 0 \quad (15b)$$

$$\sigma_{c_i}^{c_j,c_k} = 1 \text{ if } b_{c_i}^{c_j} > b_{c_i}^{c_k}; \text{ otherwise, } \sigma_{c_i}^{c_j,c_k} = 0.$$

In Constraints (7) and (8), auxiliary binary variables $\delta_s^{r_i,r_j}$ and $\delta_s^{s_i,s_j}$ are used to ensure that $m_{s,r_i} \neq m_{s,r_j}$ and $m_{s_i,r} \neq m_{s_j,r}$. Note that $\delta_s^{r_i,r_j}$ and $\delta_s^{s_i,s_j}$ or can also indicate the relation between $m_{s,r_i}$, $m_{s,r_j}$ and $m_{s_i,r}$, $m_{s_j,r}$, where $\delta_s^{r_i,r_j}=1$, meaning $m_{s_i,r} > m_{s_j,r}$. Therefore, Property (14) can be transformed into the following constraints:

$$\sigma_{c_s}^{c_{r_i},c_{r_j}} = \delta_s^{r_i,r_j}, \forall s \in S, \forall r_i, r_j \in R_s, i \neq j \quad (16a)$$

$$\sigma_{c_r}^{c_{s_i},c_{s_j}} + \delta_r^{s_i,s_j} = 1, \forall r \in R, \forall s_i, s_j \in S_r, i \neq j \quad (16b)$$

Default Paths:

Here, the invention exploits the possibility to transmit signals without activating any MRR. Because the parallelism of these signals will not be affected by any MRR, the topology parallelism can potentially increase.

For a signal (s, r), if it has the following properties: "It is the last signal to be extracted from the compound signal sent by its sender." and "It is the first signal to be recombined to the vertical waveguide towards its receiver.". Then, the two waveguides where (s, r) traverses before and after it drops/adds can be merged as one, and the MRR at the intersection can be removed. The signal path of this kind is called a default path since signals transmitted through the path do not switch waveguides during transmission.

For (s, r) to be the last signal extracted, $$b_{c_s}^{c_r}$$

must be larger than any other $$b_{c_s}^{c_{r_i}},$$

where $r_i$ is a receiver that receives a signal from s other than r. Meanwhile, for (s, r) to be the first signal recombined, $$b_{c_s}^{c_r}$$

must also be larger than any other $$b_{c_{s_i}}^{c_r},$$

where $s_i$ is a sender that transmits a signal to r other than s. Therefore, the following statements must hold for a signal path (s, r) to be a default path:

$$b_{c_s}^{c_r} > b_{c_s}^{c_{r_i}}, \forall r_i \in R_s, r_i \neq r \quad (17a)$$

$$b_{c_s}^{c_r} > b_{c_{s_i}}^{c_r}, \forall s_i \in S_r, s_i \neq s \quad (17b)$$

Meanwhile, since each $m_{s,r}$ will still take some value even if the path of (s, is a default path, K is specified as the dedicated value that $m_{s,r}$ must take when (s, r)'s signal path is a default path.

Now, constraints are set so that $m_{s,r}=K$ if and only if the path of (s, r) is a default path as follows:

$$K - m_{s,r} \le M\left(\sum_{\substack{r_i \in R_s \\ r_i \ne r}} \sigma_{c_s}^{c_{r_i}, c_r} + \sum_{\substack{s_i \in S_r \\ s_i \ne s}} \sigma_{c_s}^{c_{r_i}, c_r}\right) \quad (18a)$$

$$\left(\sum_{\substack{r_i \in R_s \\ r_i \ne r}} \sigma_{c_s}^{c_{r_i}, c_r} + \sum_{\substack{s_i \in S_r \\ s_i \ne s}} \sigma_{c_s}^{c_{r_i}, c_r}\right) \le M(K - m_{s,r}) \quad (18b)$$

When Constraint (17) holds, every a variable in Constraint (18) will take 0, and $m_{s,r}$ will be forced to take K. Similarly, if $m_{s,r}=K$, every σ variable in Constraint (18) will also be forced to take 0, making the signal path of (s, r) a default path.

Objective:

The primary goal is to minimize the MRR type usage in the topology. As a result, the objective function can be formulated as follows:

minimize $K$ (19)

Analysis of the invention's ILP Formulation:

For a set P of signal paths, the followings are defined:

$K_P$: the number of MRR types activated in the signal path set P. Then, for each design netlist d (a WRONoC design), the invention denotes:

$n_x$: the maximum number of the nonzero entries of each row in the connectivity matrix.

$n_y$: the maximum number of the nonzero entries of each column in the connectivity matrix.

$n_z = \max(n_x, n_y) - 1$.

For each topology t, the invention denotes:

$K_t$: The number of MRR types used in topology t.

Figures 10A, 10B:
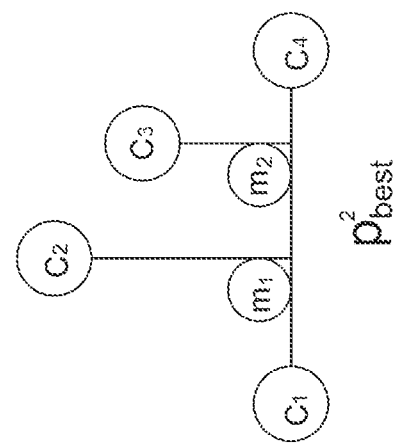
FIG. 10A illustrates the connectivity matrix for the 4×1 topology.
FIG. 10B illustrates the topology $p_{best}{}^2$.

Finally, a 1×(k+1) topology $p_{best}^k$ is introduced to analyze its parallelism. $p_{best}^k$ denotes the topology where only one core c transmits signals and c transmits signals to all other k+1 cores. That is, $p_{best}^k$ contains a single default path with k MRR types. For example, FIG. 10B shows the topology purest. FIG. 10A shows the connectivity matrix for the 4×1 topology, $p_{best}^k$. The parallelism of topology purest is then calculated.

$$v_w^T(p_{best}^k) = \min_{i \in \mathbb{Z} \cap [1,k]} \left\{\left|\Omega_i \ominus \cup_{j=1}^{i-1} \Omega_j\right|\right\} \quad (20)$$

Lemma 1:

For all topology t with design netlist d, $v_w^T(p_{best}^{n_z})$ is an upper bound of $v_w^T(t)$.

Proof 1:

Because the number of nonzero items in each row of a connectivity matrix represents the number of receivers to which a sender must transmit, and the number of nonzero items in each column represents the number of senders from which a receiver must receive, there must exist at least one core c that activates at least $n_z$ MRR types to transmit/receive signals in topology t. Assume P c is the set of signal paths that use c as the sender or the receiver. The relation can be described as follows:

$$v_w(P_c) = \min_{i \in \mathbb{Z}^+ \cap [1,n_z]} \left\{\left|(\Omega_i \ominus \cup_{j=1}^{i-1} \Omega_j) \ominus \cup_{j \in h} \Omega_j\right|\right\}, \quad (21)$$

$h = \{j \mid \beta_j^i = 1, j \in \mathbb{Z}^+ \cap [i+1, n_z]\},$ where $\beta_j^i$ is a binary variable, indicating whether MRR type $m_i$ is in the off-resonance set of the signal path that activates MRR type $m_i$ in $P_c$. From Equation (20), we can see that $v_w^T(p_{best}^k)$ is an upper bound for $v_w(P_c)$ when $k \le n_z$. Meanwhile, $v_w(P_c)$ must be an upper bound for $v_w^T(t)$ since $P_c$ contains only part of the signal paths in t. Therefore, the invention has the relation:

$$v_w^T(t) \le v_w(P_c) \le v_w^T(p_{best}^{n_z}) \quad (22)$$

Lemma 2:

For a topology t that satisfies nice property, $v_w^T(p_{best}^k)$ is a lower bound for $v_w^T(t)$.

Proof 2:

Assume topology t satisfies nice property. For a signal path p in t that drops/adds with MRR type $m_i$, the parallelism of p is as follows:

$v(p) = |\Omega_i \ominus \cup_{j \in J} \Omega_j|,$ $J = \{j \mid m_j \in \mathit{Off}_p, j \in \mathbb{Z}^+[1, i-1]\} \quad (23)$ Since $i \le K_t$, in topology $p_{best}^k$, there exists a signal path p' that drops/adds with MRR type $m_i$. The parallelism of p' is $v(p') = |\Omega_i \ominus \cup_{j=1}^{i-1} \Omega_j| \quad (24)$ It can be seen that v(p') is a lower bound of v(p), implying that $v_w^T(p_{best}^{Kt})$ is a lower bound for $v_w^T(t)$ because we can always find a p' in $p_{best}^{Kt}$ such that $v(p') \le v(p)$ for all signal paths p's in t. Therefore, for a topology t that satisfies Property (6), $v_w^T(p_{best}^{Kt})$ is a lower bound for $v_w^T(t)$.

Theorem 1:

For all topology t with design netlist d, if t satisfies Property (6), t is parallelism-optimal if $K_t = n_z$.

Proof 3:

According to Lemmas 1 and 2, $v_w^T(t)$ is bounded above by $v_w^T(p_{best}^{n_z})$ and bounded below by $v_w^T(p_{best}^k)$. If $n_z$ equals $K_t$, then $v_w^T(t)$ is simultaneously bounded below and above by $v_w^T(p_{best}^{n_z})$. That is, $v_w^T(t)$ achieves its upper bound, and thus t is parallelism-optimal.

Message Routing for Full-Connectivity Netlist:

According to the above-mentioned, it shows the proposed message routing method for an N×(N−1) full-connectivity netlist without using the aforementioned ILP formulation. The technique determines core positions and MRR types immediately. In a fully-connected topology, every core transmits and receives signals to/from all other cores. Furthermore, each core has the same connectivity in our network template. As a result, given a netlist with full connectivity, each core's position by placing core $c_i$ on the i-th potential position can be immediately determined.

Meanwhile, to satisfy Property (6), there is only one possible MRR type assignment. Let $m_{c^i, c^j}$ denote the MRR type that each signal from core $c_i$ to core $c_j$ activates, where $c_i$ denotes the core placed at the absolute position i. The value of each $m_{c^i, c^j}$ is decided as follows:

$$m_{c^i, c^j} = \begin{cases} \mod(j-i, N-2) & \text{if } i < j \text{ and } j-i \ne N-1 \\ \mod(j+N-i, N-2) & \text{if } i > j \text{ and } i-j \ne 1 \\ - & \text{otherwise} \end{cases} \quad (25)$$

where mod (i, j) denotes the remainder of the division of i by j. As a result, given a netlist with full connectivity, it can use Equation (25) to decide each MRR's type immediately.

Figure 11:
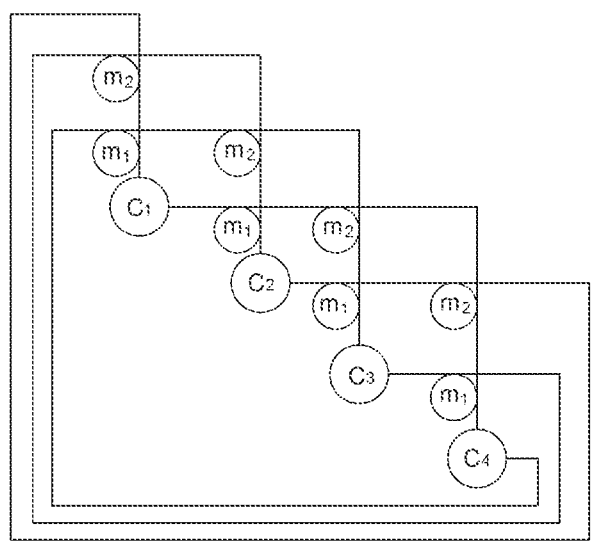
FIG. 11 illustrates parallelism-optimal 4×3 topology.

In this MRR type assignment, the topology uses exactly N−2 different MRR types, the minimum number of MRR types. According to Theorem 1, the proposed fully-connected N×(N−1) topology is thus parallelism-optimal. FIG. 11 shows the invention's parallelism-optimal 4×3 fully-connected topology.

MRR-Radius Selection:

After generating a parallelism-aware topology, for MRR-Radius Selection 620, a simulated annealing (SA) 622 is used to select the radius for each MRR type and performs a final refinement 624 to improve the result further.

The proposed method of MRR-radius selection 620 works for the parallelism-optimal topology t because the parallelism calculation for t can be simplified as the parallelism calculation for $p_{best}^{Kt}$. Therefore, MRR-radius selection 620 for t is equivalent to MRR-radius selection for $p_{best}^{Kt}$, and it can model the problem by selecting a sequence of radii from MRR-radius options. With this effective representation, it is natural to use SA to solve the MRR-radius selection problem.

Simulated Annealing:

The objective of this step is to select a radius from MRR-radius options for each MRR type in a given topology. The radius sequence $\langle \rho_k \rangle$ is introduced to denote a sequence of the radii ρ1 selected by each MRR type $m_i$. With the radius sequence $\langle \rho_k \rangle$ to represent the current MRR-radius selection result, one radius sequence is perturbed to another by using the following three operations:

Op1: Replace a radius in $\langle \rho_k \rangle$ with an unselected radius from MRR-radius options;
Op2: Change the radius order in $\langle \rho_k \rangle$;
Op3: Sort $\langle \rho_k \rangle$.

For Op1, it performs to delete a radius in $\langle \rho_k \rangle$ and insert an unselected radius from the MRR-radius options to $\langle \rho_k \rangle$. For Op2, it performs to swap two radii ρi and ρj in $\langle \rho_k \rangle$. For Op3, it performs to sort $\langle \rho_k \rangle$ according to the cardinality of the resonance wavelength of each radius ρi. Op3 is an accelerating operation to help $\langle \rho_k \rangle$ escape from the zero worst-case parallelism region.

The cost function (objective function) of a radius sequence $\langle \rho_k \rangle$ is defined based on the parallelism as follows:

$$L(\langle \rho_k \rangle) = -(v_{worst} - \frac{n_w}{n_\rho}) \quad (26)$$

where $v_{worst}$ is the worst-case parallelism, $n_w$ is the number of radii whose parallelism is $v_{worst}$, and $n_w$ is the length of $\langle \rho_k \rangle$.

The second term in Equation (26) speeds up the SA. Suppose the cost function includes only $v_{worst}$. Then, $v_{worst}$ will change only if the parallelism in all signal paths is greater than the original worst-case parallelism, making it hard to escape from a local minimum. With the second term, the cost function has a better chance of leaving a local minimum and achieving higher parallelism, thereby speeding up the SA process.

Final Refinement:

After generating a radius sequence $\langle \rho_k \rangle$, in the final refinement 624, a greedy method is used to swap the adjacency radii ρi and $\rho_{i+1}$. In this manner, it can offer a better radius sequence in time complexity $O(n^2)$. Then, the parallelism-aware wavelength-routed optical networks-on-chip (WRONoC) design is finished 626.

Experimental Results:

The invention conducted three experiments to show the effectiveness and efficiency of the proposed parallelism-aware WRONoC design algorithm. These three experiments were performed on an Intel Xeon 3.2 GHz workstation with 192 GB memory in the C++ programming language. In ILP-based topology generation and MRR-radius selection, the Gurobi Optimizer (please refer to: Gurobi optimizer reference manual, Gurobi Optimization, Inc., 2018. [Online]. Available https://www.gurobi.com/) is used as the ILP problem solver. The parameters for MRR-radius selection are the same as those in Li et al. (please refer to: M. Li, T.-M. Tseng, M. Tala, and U. Schlichtmann, "Maximizing the communication parallelism for wavelength-routed optical networks-on-chips," in Proc. of ASPDA, 2020): the MRR-radius options range between 5 μm and 30 μm with an incremental step of 0.25 μm, the available wavelength band is in [1500 nm, 1600 nm], and the minimal spacing Δ equals 0.8 nm. We also set the transmission losses the same as those in FAST (please refer to: X. Moyuan, T. Tsun-Ming, and S. Ulf, "FAST: A fast automatic sweeping topology customization method for application-specific wavelength-routed optical NoCs," in Proc. of DATE, 2021): 0.5 dB per drop, 0.04 dB per cross, and 0.005 dB per through.

In the first experiment, the parallelism and the maximum insertion loss of our fully-connected topology is compared with the previous works GWOR (X. Tan, M. Yang, L. Zhang, Y. Jiang, and J. Yang, "On a scalable, non-blocking optical router for photonic networks-on-chip designs," in Proc. of SOPO, 2011) and λ-router (M. Briere, B. Girodias, Y. Bouchebaba, G. Nicolescu, F. Mieyeville, F. Gaffiot, and I. O'Connor, "System level assessment of an optical NoC in an MPSoC platform," in Proc. of DATE, 2007), reported in Table 1. For parallelism evaluation, the method in Li et al. is implemented to perform MRR-radius selection. The cases where the MRR-radius selection algorithm failed to terminate in 12 hours are marked with *, and the reported parallelism numbers are intermediate solutions. As shown in Table 1, the proposed fully-connected topology (OUR) achieved a 39.6% improvement on parallelism and a 3.4% maximum insertion loss reduction compared with GWOR. Besides, the proposed fully-connected topology achieved an 81.8% improvement on parallelism with a 1.2% maximum insertion loss overhead compared with λ-router.

TABLE 1

| Topology | #Core | #Drop | #Crossing | #Through | Max IL (dB) | $v_{worst}$ | Time (s) |
| --- | --- | --- | --- | --- | --- | --- | --- |
| GWOR | 4 | 1 | 2 | 4 | 0.6 | 16 | 41 |
| λ-router |  | 1 | 2 | 4 | 0.65 | 11 | 6799 |
| OUR |  | 1 | 2 | 2 | 0.59 | 18 | 6 |
| GWOR | 8 | 1 | 10 | 20 | 1 | 6* | 43201* |
| λ-router |  | 1 | 7 | 14 | 0.85 | 5* | 43202* |
| OUR |  | 1 | 10 | 10 | 0.95 | 10 | 21150 |

In the second experiment, the proposed customized topology is compared with the previous work FAST. Based on their seven benchmarks, the MRR usage, the maximum insertion loss, and the runtime from FAST are reported. To compare the parallelism, the engine in FAST is implemented to generate their topologies and the MRR-radius selection method in in Li et al. to perform the parallelism evaluation. In Table 2, the cases where the MRR-radius selection algorithm failed to terminate in 12 hours are marked with *, and the reported parallelism numbers are intermediate solutions. As shown in Table 2, the proposed customized topology (OUR) achieved a 31.6% improvement on parallelism and a 10.2% reduction on the MRR usage with a 21.5% maximum insertion loss overhead. According to Theorem 1, the proposed customized topology is parallelism optimal in all the seven FAST test cases. Note that the maximum insertion loss in the proposed topology is higher because the invention strictly places each core's sender and receiver together. In this scenario, the physical implementation for the invention's topology can avoid unnecessary crossings.

TABLE 3-continued

| #Core | ICCAD'16 | | ASPDAC'20 | | OUR | |
|---|---|---|---|---|---|---|
| | $v_{worst}$ | Time (s) | $v_{worst}$ | Time (s) | $v_{worst}$ | Time (s) |
| 32 | X | X | X | X | 2 | 1050 |
| 36 | X | X | X | X | 1 | 1303 |

Overall, the invention's topology generation algorithm can obtain topology designs with significantly better parallelism, and the invention's MRR-radius selection method can deal with much larger network sizes without performance loss. The reasons for these strengths are analyzed as follows:

In most practical cases, the proposed ILP-based topology generation method can find a feasible design that satisfies Property (6), making the resulting topology parallelism-optimal.

TABLE 2

| Benchmark | #Core | #Comm. | FAST | | | | | OUR | | | | |
|---|---|---|---|---|---|---|---|---|---|---|---|---|
| | | | #MRR Type | #MRR | Max IL (dB) | Time (s) | $v_{worst}$ | #MRR Type | #MRR | Max IL (dB) | Time (s) | $v_{worst}$ |
| Case1 | 8 | 44 | 6 | 36 | 0.835 | 0.04 | 7* | 6 | 39 | 0.95 | 0.17 | 10 |
| Case2 | 12 | 26 | 6 | 24 | 0.77 | 1.25 | 8* | 6 | 21 | 1.125 | 0.834 | 10 |
| Case3 | 12 | 20 | 4 | 14 | 0.64 | 1.65 | 10 | 4 | 13 | 0.875 | 0.22 | 13 |
| Case4 | 16 | 22 | 6 | 19 | 0.73 | 1.5 | 9 | 6 | 12 | 0.885 | 0.7 | 10 |
| Case5 | 8 | 48 | 8 | 40 | 0.9 | 0.04 | 8 | 5 | 40 | 0.94 | 0.95 | 11 |
| Case6 | 8 | 24 | 8 | 20 | 0.82 | 0.31 | 8 | 5 | 20 | 0.925 | 0.13 | 11 |
| Case7 | 8 | 24 | 8 | 24 | 0.8 | 0.03 | 8 | 5 | 20 | 0.925 | 0.02 | 11 |
| Comp. | — | — | 1.00 | 1.13 | 0.83 | 2.19 | 0.76 | 1.00 | 1.00 | 1.00 | 1.00 | 1.00 |

In the third experiment, the parallelism and runtime of the proposed MRR-radius selection algorithms are compared with two previous works (A. Peano, L. Ramini, M. Gavanelli, M. Nonato, and D. Bertozzi, "Design technology for fault-free and maximally-parallel wavelength-routed optical networks-on-chip," in Proc. of ICCAD, 2016; Li et al.). In Table 3, the method used in Peano et al. is denoted as "ICCAD'16" and that in Li et al. as "ASPDAC'20". Besides, the cases where the MRR-radius selection algorithm failed to terminate in 12 hours are marked with *, and the reported parallelism numbers are intermediate solutions. As shown in Table 3, the proposed MRR-radius selection method (OUR) significantly reduced the runtime without performance loss. Besides, the invention can deal with much larger network sizes (32 and more) while the previous works can handle only up to 20 cores in feasible runtime.

TABLE 3

| #Core | ICCAD'16 | | ASPDAC'20 | | OUR | |
|---|---|---|---|---|---|---|
| | $v_{worst}$ | Time (s) | $v_{worst}$ | Time (s) | $v_{worst}$ | Time (s) |
| 4 | 16 | 7 | 18 | 2.7 | 18 | 1.72 |
| 6 | 10 | 440 | 13 | 312 | 13 | 4.05 |
| 8 | 7 | 744 | 10 | 21150 | 10 | 6.30 |
| 10 | 4 | 766 | 7 | 37518 | 7 | 8.11 |
| 12 | 2 | 6273 | 5* | 43200* | 6 | 10.46 |
| 14 | 1* | 43202* | 3* | 43202* | 4 | 12.49 |
| 16 | 1* | 43201* | 2* | 43201* | 4 | 14.64 |
| 20 | 1* | 43201* | x | X | 3 | 18.01 |
| 24 | X | X | X | X | 2 | 21.98 |
| 28 | X | X | X | X | 2 | 25.85 |

The proposed SA-based MRR-radius selection searches the solution space efficiently to find a feasible solution even in large cases.

The invention's contributions are summarized as follows:

(1) The proposed design flow considers parallelism during WRONoC topology generation and MRR-radius selection. The invention considers multi-wavelength resonance property to maximize parallelism during WRONoC topology generation.

(2) The proposed topology generation algorithm guarantees to generate a parallelism-optimal topology for full connectivity; and parallelism-optimal topology for customized connectivity if the netlist meets certain conditions.

(3) The invention proposes an integer linear programming (ILP) formulation to maximize the parallelism for the customized WRONoC netlist. The design flow can generate parallelism-optimal topologies for all the test cases in FAST.

(4) The invention proposes an efficient MRR-radius selection method for the topologies; as a result, the invention can deal with much larger network sizes (32 and more) while the previous works can handle only up to 20 cores in feasible runtime.

As will be understood by persons skilled in the art, the foregoing preferred embodiment of the present invention illustrates the present invention rather than limiting the present invention. Having described the invention in connection with a preferred embodiment, modifications will be suggested to those skilled in the art. Thus, the invention is not to be limited to this embodiment, but rather the invention is intended to cover various modifications and similar arrangements included within the spirit and scope of the appended claims, the scope of which should be accorded the broadest interpretation, thereby encompassing all such modifications and similar structures. While the preferred embodiment of the invention has been illustrated and described, it will be appreciated that various changes can be made without departing from the spirit and scope of the invention.

What is claimed is:

1. A non-transitory computer-readable medium containing instructions, which when read and executed by a computer, cause the computer to execute a method of a parallelism-aware wavelength-routed optical networks-on-chip (WRONoC) design, wherein the method comprises steps of:
providing a WRONoC netlist, design specs and design rules stored in a memory for said computer-readable medium;
performing a network construction such that potential positions of each core of a plurality of cores, a plurality of waveguides and a plurality of microring resonators (MRRs) are determined to create a topology stored in said memory;
performing a message routing to minimize MRR type usage of said MRRs in said topology; and
performing a MRR radius selection to select a radius from MRR-radius options for each MRR type in said topology based on a simulated annealing.

2. The non-transitory computer-readable medium of claim 1, where said each core of said plurality of cores is decomposed into a sender-receiver pair.

3. The non-transitory computer-readable medium of claim 2, where said plurality of waveguides are classified into horizontal waveguides, vertical waveguides and ring-like waveguides in said network construction.

4. The non-transitory computer-readable medium of claim 3, where potential positions of said horizontal waveguides are on each core's right, allowing a signal emission from senders, potential positions of said vertical waveguides are on each core's top, allowing a signal transmission to receivers, and potential positions of said ring-like waveguides are close to a boundary of said topology, connecting said horizontal waveguides on a bottom-right and said vertical waveguides on a top-left in said network construction.

5. The non-transitory computer-readable medium of claim 2, wherein signals transmitted from an identical sender are activating different MRR types during said message routing.

6. The non-transitory computer-readable medium of claim 5, wherein signals transmitted to an identical receiver are activating different MRR types during said message routing.

7. The non-transitory computer-readable medium of claim 6, wherein said each core of said plurality of cores is occupied a unique absolute position during said message routing.

8. The non-transitory computer-readable medium of claim 7, wherein a default path has a last signal extracted from compound signal sent by its sender, and a first signal recombined to said vertical waveguide towards its receiver.

9. The non-transitory computer-readable medium of claim 1, wherein said simulated annealing is performing to replace a radius in a radius sequence with an unselected radius from said MRR-radius options.

10. The non-transitory computer-readable medium of claim 9, wherein said simulated annealing is performing to further swap two radii in said radius sequence and sort said radius sequence according to a cardinality of a resonance wavelength of each radius.

11. A method of a parallelism-aware wavelength-routed optical networks-on-chip (WRONoC) design, which is executed by a computer, the method comprising:
using the computer to perform the following:
providing a WRONoC netlist, design specs and design rules stored in a memory for computer-readable medium;
performing a network construction such that potential positions of each core of a plurality of cores, a plurality of waveguides and a plurality of microring resonators (MRRs) are determined to create a topology stored in said memory;
performing a message routing to minimize MRR type usage of said MRRs in said topology; and
performing a MRR radius selection to select a radius from MRR-radius options for each MRR type in said topology based on a simulated annealing.

12. The method of claim 11, where said each core of said plurality of cores is decomposed into a sender-receiver pair.

13. The method of claim 12, wherein said plurality of waveguides are classified into horizontal waveguides, vertical waveguides and ring-like waveguides in said network construction.

14. The method of claim 13, wherein potential positions of said horizontal waveguides are on each core's right, allowing a signal emission from senders, potential positions of said vertical waveguides are on each core's top, allowing a signal transmission to receivers, and potential positions of said ring-like waveguides are close to a boundary of said topology, connecting said horizontal waveguides on a bottom-right and said vertical waveguides on a top-left in said network construction.

15. The method of claim 12, wherein signals transmitted from an identical sender are activating different MRR types during said message routing.

16. The method of claim 15, wherein signals transmitted to an identical receiver are activating different MRR types during said message routing.

17. The method of claim 16, wherein said each core of said plurality of cores is occupied a unique absolute position during said message routing.

18. The method of claim 17, wherein a default path has a last signal extracted from compound signal sent by its sender, and a first signal recombined to said vertical waveguide towards its receiver.

19. The method of claim 11, wherein said simulated annealing is performing to replace a radius in a radius sequence with an unselected radius from said MRR-radius options.

20. The method of claim 19, wherein said simulated annealing is performing to further swap two radii in said radius sequence and sort said radius sequence according to a cardinality of a resonance wavelength of each radius.

* * * * *